United States Patent
Ma et al.

(10) Patent No.: US 9,988,718 B2
(45) Date of Patent: Jun. 5, 2018

(54) DIRECTED ENERGY DEPOSITION WITH COOLING MECHANISM

(71) Applicant: Rolls-Royce Corporation, Indianapolis, IN (US)

(72) Inventors: Kong Ma, Carmel, IN (US); Quinlan Y. Shuck, Indianapolis, IN (US); Jacque S. Bader, Martinsville, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days. days.

(21) Appl. No.: 15/184,598

(22) Filed: Jun. 16, 2016

(65) Prior Publication Data
US 2016/0369399 A1 Dec. 22, 2016

Related U.S. Application Data

(60) Provisional application No. 62/182,176, filed on Jun. 19, 2015.

(51) Int. Cl.
*C23C 16/46* (2006.01)
*B23K 26/14* (2014.01)
(Continued)

(52) U.S. Cl.
CPC .............. *C23C 16/463* (2013.01); *B05B 3/00* (2013.01); *B23K 26/144* (2015.10); *B29C 67/00* (2013.01);
(Continued)

(58) Field of Classification Search
CPC ................ B23K 37/003; B23K 26/144; B23K 26/1464; B23K 26/147; B29C 64/153; B33Y 30/00; B33Y 40/00; C23C 16/463
See application file for complete search history.

(56) References Cited

U.S. PATENT DOCUMENTS

| | | | |
|---|---|---|---|
| 4,724,299 A * | 2/1988 | Hammeke | B05B 7/1486 219/121.84 |
| 6,040,039 A * | 3/2000 | Ikeda | H01L 23/15 174/259 |

(Continued)

FOREIGN PATENT DOCUMENTS

| | | | |
|---|---|---|---|
| DE | 29620304 U1 * | 1/1997 | |
| EP | 274081 A2 * | 7/1988 | |
| JP | 9-99385 A * | 4/1997 | |

OTHER PUBLICATIONS

Machine translation of Japan Patent document No. 9-99,385, Aug. 2017.*

(Continued)

*Primary Examiner* — Geoffrey S Evans
(74) *Attorney, Agent, or Firm* — Barnes & Thornburg LLP

(57) ABSTRACT

A material deposition system and method for cooling a component after material deposition. The method of deposition and cooling comprising a platform, a deposition head, and a cooling mechanism. The platform adapted to support a component for the addition of material. The deposition head including a material depositor configured to deposit material on a surface of a component supported on the platform an and an energy source configured to energize material deposited onto a surface of a component supported on the platform to bond the material to the component. The cooling system including bristles.

15 Claims, 3 Drawing Sheets

(51) Int. Cl.
  *B23K 26/144* (2014.01)
  *B05B 3/00* (2006.01)
  *B29C 67/00* (2017.01)
  *F01D 5/00* (2006.01)
  *B33Y 10/00* (2015.01)
  *B33Y 30/00* (2015.01)
  *B33Y 40/00* (2015.01)

(52) U.S. Cl.
  CPC .......... *B29C 67/0077* (2013.01); *B33Y 10/00* (2014.12); *B33Y 30/00* (2014.12); *B33Y 40/00* (2014.12); *F01D 5/005* (2013.01)

(56) References Cited

U.S. PATENT DOCUMENTS

| | | | |
|---|---|---|---|
| 6,136,252 A | 10/2000 | Bedal et al. | |
| 6,162,378 A | 12/2000 | Bedal et al. | |
| 6,660,209 B2 | 12/2003 | Leyden et al. | |
| 8,219,234 B2 | 7/2012 | Kritchman et al. | |
| 8,287,794 B2 | 10/2012 | Pax et al. | |
| 8,784,723 B2 | 7/2014 | Napadensky | |
| 2002/0053422 A1 | 5/2002 | Juslenius et al. | |
| 2006/0169679 A1* | 8/2006 | Sato | B23K 26/103 219/121.64 |
| 2007/0181060 A1* | 8/2007 | Renn | C23C 24/04 118/300 |
| 2007/0284095 A1* | 12/2007 | Wang | F28D 7/10 165/166 |
| 2010/0276121 A1 | 11/2010 | Sagie et al. | |
| 2011/0214850 A1 | 9/2011 | Lashmore et al. | |
| 2012/0199564 A1* | 8/2012 | Washko, Jr. | B23K 26/147 219/121.63 |
| 2013/0199770 A1 | 8/2013 | Cherian | |
| 2013/0319325 A1* | 12/2013 | Whitfield | B23K 26/34 118/620 |
| 2016/0207108 A1* | 7/2016 | Daum | B29C 64/20 |
| 2016/0288264 A1* | 10/2016 | Jones | B22F 7/08 |
| 2017/0120517 A1* | 5/2017 | Shimoyama | B29C 67/0059 |

OTHER PUBLICATIONS

Machine translation of German Patent document No. 29620304 U1, Feb. 2018.*

* cited by examiner

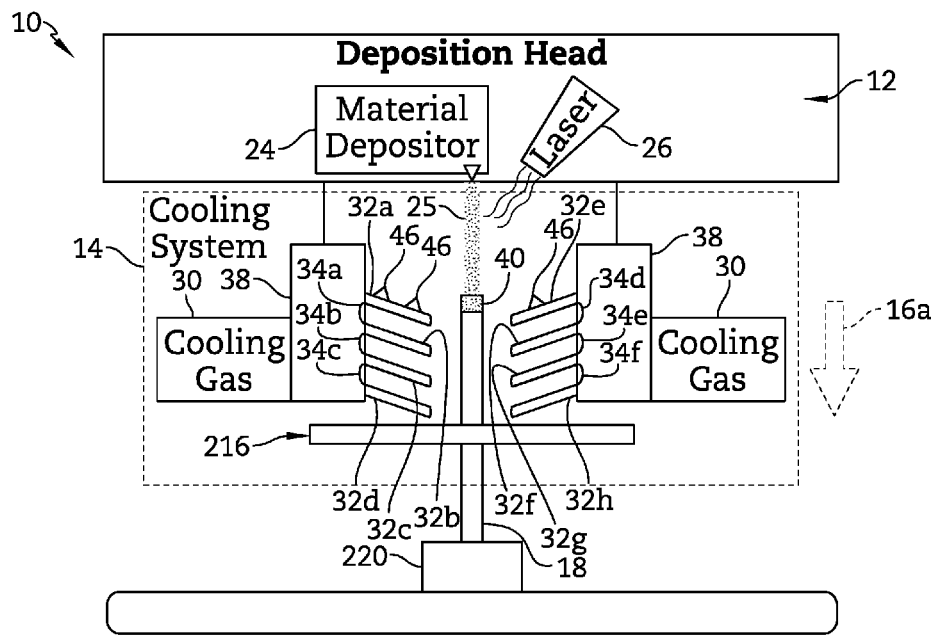
*FIG. 3*
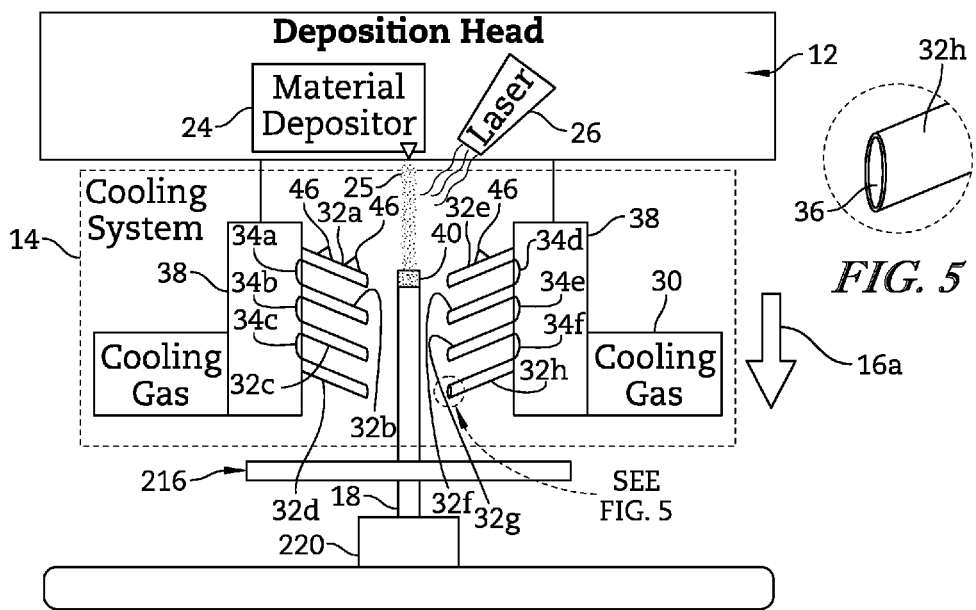
*FIG. 4*
*FIG. 5*

DIRECTED ENERGY DEPOSITION WITH COOLING MECHANISM

CROSS REFERENCE TO RELATED APPLICATIONS

This application claims priority to and the benefit of U.S. Provisional Patent Application No. 62/182,176, filed 19 Jun. 2015, the disclosure of which is now expressly incorporated herein by reference.

FIELD OF THE DISCLOSURE

The present disclosure relates generally to material addition systems, and more specifically cooling of material addition systems.

BACKGROUND

Methods of building or repairing gas turbine engine components include additive material deposition. During additive material deposition material is blown onto a component and energized to bond the blown material to the component and build up the component.

As material and energy are added to the component the mechanical properties and microstructure of the component may change. The changes in the mechanical properties and microstructure may be due to changes in cooling rates between the material addition area and the rest of the component. Currently thermography may be used to measure the changes in cooling rate of the component and subsequently adjust control of the deposition process to compensate for the changes in cooling rate and changes in mechanical properties and microstructure of the component.

Gas turbine engine components, for example, may become worn through use in the gas turbine engine. Methods of repairing such gas turbine engine components may include additive material deposition. Such methods may benefit from the addition of steps and/or mechanisms to control the temperature of the component being repaired and, thereby to control changes to the mechanical properties and/or microstructure of the gas turbine engine component repaired.

SUMMARY

The present disclosure may comprise one or more of the following features and combinations thereof.

According to an aspect of the present disclosure, a material deposition system is taught. The material deposition system may comprise a platform, a deposition head, and a cooling mechanism. The platform may be adapted to support a component for the addition of material. The deposition head may include a material depositor configured to deposit material on a surface of a component supported on the platform and an energy source configured to energize material deposited onto a surface of a component supported on the platform to bond the material to the component. The cooling mechanism may include a gas source configured to discharge cooling medium toward a component supported on the platform and a plurality of conductive bristles arranged to interact with cooling medium discharged from the gas source toward a component supported on the platform when the gas source discharges cooling medium.

According to another aspect of the present disclosure a material deposition system is taught. The material deposition system may comprise a platform, a deposition head, and a cooling mechanism. The deposition head may include a material depositor and an energy source. The cooling mechanism may include a gas source configured to discharge cooling air toward a component supported on the platform and a plurality of bristles.

According to another aspect of the present disclosure a method of material addition is taught. The method may comprise depositing a material from a deposition head onto a material addition area of a component supported by a platform, energizing the material deposited onto the material addition area of the component to bond the material to the component, and discharging cooling medium toward the material addition area of the component, wherein the cooling medium flows along a plurality of conductive bristles arranged between the gas source and the component.

These and other features of the present disclosure will become more apparent from the following description of the illustrative embodiments.

BRIEF DESCRIPTION OF THE DRAWINGS

FIG. 3 is a partially diagrammatic view of another material deposition system including a platform adapted to support a component, a deposition head including a material depositor and a laser, a cooling mechanism including conductive bristles for directing cooling medium to the component, and optionally purging gas nozzles for inhibiting material addition onto the conductive bristles;

FIG. 4 is a partially diagrammatic view of the material deposition system of FIG. 3 depicting the platform moved away from the deposition head by a hydraulic actuator as material is added to the component to maintain a controlled distance between the deposition head and a material addition area of the component;

FIG. 5 is an enlarged view of a passageway formed by one of the conductive bristle shown in FIG. 4.

DETAILED DESCRIPTION

Figure 1:
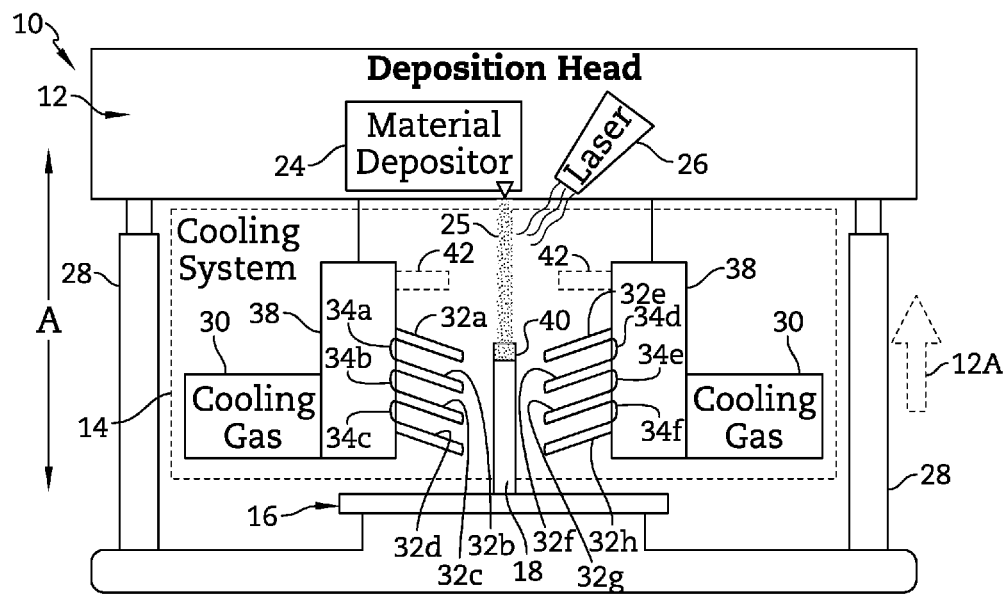
FIG. 1 is a partially diagrammatic view of a material deposition system including a platform adapted to support a component, a deposition head including a material depositor and a laser, a cooling mechanism including conductive bristles for directing cooling medium to the component, and, optionally, a shield for inhibiting material addition onto the conductive bristles.

For the purposes of promoting an understanding of the principles of the disclosure, reference will now be made to a number of illustrative embodiments illustrated in the drawings and specific language will be used to describe the same.

A material deposition system and method for material deposition are described herein. Material deposition may be used to repair a component or build a component for use in a gas turbine engine. Material deposition may include depositing material and energizing or heating the material to bond the material to the component. The changes in temperature may lead to further repairs.

A material deposition system 10 may include a platform 16 for supporting a component 18, a deposition head 12, and a cooling mechanism 14, as shown in FIG. 1. The cooling mechanism 14 may include conductive bristles 32a-h to maintain a controlled temperature profile for the component 18 as material and energy are added to the component 18.

The platform 16 may be used to support a component 18 for material addition, as shown in FIG. 1. The platform 16 may be coupled to a table, the ground, or any other surface for supporting the platform 16. In some examples, the platform 16 may be a flat surface for holding the component 18. The platform 16 may include a cut out portion or a fixture built for positioning and holding the component 18.

Figure 2:
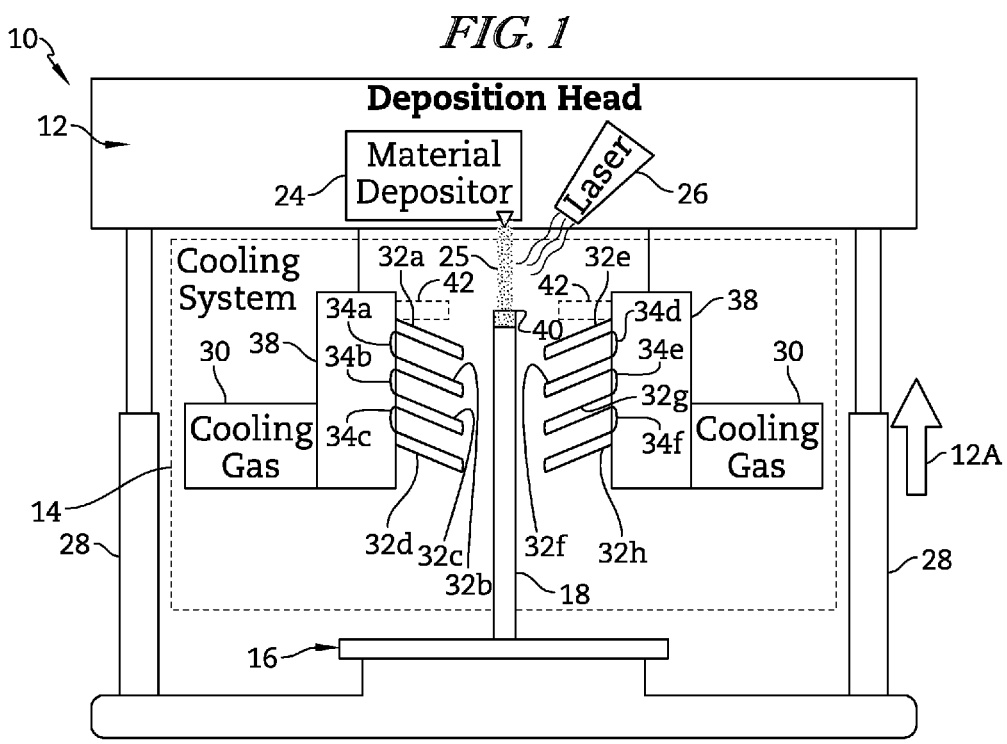
FIG. 2 is a partially diagrammatic view of the material deposition system of FIG. 1 depicting the deposition head moved away from the component by a hydraulic actuator as material is added to the component to maintain a controlled distance between the deposition head and a material addition area of the component.

The deposition head 12 may be configured to deposit and energize material, as suggested in FIGS. 1 and 2. The deposition head 12 includes a material depositor 24 and an energy source 26, as shown in FIGS. 1 and 2. The material depositor 24 deposits loose material 25 to be added onto the component 18. The energy source 26 is configured to energize the material deposited by the material depositor 24 and thereby bond it to the component 18.

In some embodiments, the deposition head 12 may be moveable, as suggested in FIGS. 1 and 2. The movement of the deposition head 12 may be controlled by a hydraulic actuator 28, a motor, or any other means for moving the deposition head 12. The deposition head 12 may move along an upward/downward line A, as shown in FIG. 1. As the deposition head 12 moves along line A, the deposition head 12 may become closer and further away from the component 18. As material is added to the component 18 the deposition head 12 may move away from the component 18 to allow the component 18 to grow, as shown in FIG. 2.

The material depositor 24 may deposit loose material 25 on a material addition surface 40 of a component 18 supported on the platform 16, as shown in FIG. 1. The material depositor 24 may deposit a powder feedstock at predetermined locations along the component 18. Material may be deposited onto the surface 40 of the component 18 to support blown powder directed energy deposition. The material depositor 24 may deposit a single layer of material to repair or build the component 18. In other examples, the material depositor 24 may deposit a plurality of material layers to repair or build the component 18.

The energy source 26 may energize the material deposited by the material depositor 24 onto the surface 40 of a component 18 supported on the platform 16 to bond the material to the component 18, as shown in FIG. 1. The energy source 26 may be any type of directed energy beam such as the laser 26 depicted in FIGS. 1-4. The energy source 26 may also be microwaves or any other device for emitting highly focused energy. The energy source 26 may be selected such that the energy source 26 emits a frequency or wavelength to couple with the material deposited on the component 18 by the material depositor 24.

The cooling mechanism 14 may illustratively include a gas source 30 and a plurality of thermally conductive bristles 32a-h, as shown in FIG. 1. The conductive bristles 32a-h may be arranged to interact with a cooling medium discharged from the gas source 30 toward component 18 supported on the platform 16. In some embodiments, the gas source 30 may be a tank for storing liquid cooling medium. The gas source 30 may include a gas tank, or other gas storage device. The gas source 30 may be in close proximity to the conductive bristles 32a-h and may be fluidly coupled to the bristles 32a-h by a diffuser 38, as shown in FIGS. 1-4. In other examples, the gas source 30 may be further removed from the conductive bristles 32 and may connect to the bristles 32a-h via piping or tubing. In some embodiments, the cooling medium may flow from the gas source 30 through a plurality of cooling nozzles 34a-f, along the conductive bristles 32a-h to the component 18.

In some examples, the cooling medium may include an inert gas such as argon, helium, nitrogen, hydrogen, carbon dioxide, or a combination thereof. A gaseous state or gas of one of the above examples may be used. In other examples, the cooling medium may include a fluid to improve heat transfer. Specifically, the fluid may be liquid argon, liquid helium, liquid nitrogen, liquid, hydrogen, liquid carbon dioxide, or a combination thereof.

As shown in FIG. 1, the conductive bristles 32a-h may direct the cooling medium along the conductive bristle 32a-h to the component 18. The conductive bristles 32 may be solid. The solid conductive bristles 32a-h may allow the cooling medium to flow along the surface of the conductive bristles 32a-h to the component 18. The conductive bristles 32a-h may have a conductivity between about 1 W/(m K) and about 450 W/(m K) at 25° C. Thermal conductivity may be the ability for a material to conduct heat. Thermal conductivity may be measured as the quantity of heat transmitted throughout a unit thickness of a material in a direction normal to the surface unit area due to a unit temperature gradient under steady state conditions. Specifically, the bristles 32a-h may comprise copper, nickel, aluminum, silver, molybdenum, or a combination thereof. The conductive bristles 32a-h may allow transfer of heat from the component 18 to the conductive bristles 32a-h to maintain consistent cooling in the area of the material addition.

The conductive bristles 32a-h may be flexible to allow for interaction with the component 18. The conductive bristles 32a-h may touch the component 18 to conduct heat from the component 18. In some examples, the conductive bristles 32a-h may not touch the component 18 directly, but may have a close interaction to allow for the transfer of heat from the component 18 to the bristles 32a-h. The flexibility of the conductive bristles 32a-h may allow the conductive bristles to conform to the shape of the component 18 to assist with maintaining consistent cooling.

The conductive bristles 32a-h may be located between the platform 16 and the deposition head 12, as shown in FIGS. 1-4. The conductive bristles 32a-h may be mounted to the deposition head 12, as shown in FIGS. 1-4. The diffuser 38 may include a plurality of cooling medium nozzles 34a-f to direct cooling medium along the conductive bristles 32a-h toward the component 18. The conductive bristles 32a-h may be coupled to the deposition head 12 for movement with the deposition head 12. Specifically, the diffuser 38 may be coupled to the deposition head 12 to assist with keeping the conductive bristles 32aa-h stationary in relation to the deposition head 12. In some examples, the diffuser 38 may be moveable in relation to the deposition head 12. The diffuser may move along the line A in relation to the deposition head 12, as shown in FIG. 1.

The platform 16 may be stationary and the deposition head 12 may be moveable, as suggested in FIGS. 1 and 2. The deposition head 12 may move along the line A, as shown in FIG. 1. As material is added to the component 18, the deposition head 12 may move away from the component 18 to maintain a controlled distance between the deposition head 12 and a material addition area 40 of the component 18, as suggested by arrow 12a, shown in FIGS. 1 and 2. The deposition head 12 may be moved by a hydraulic actuator 28, or a motor for assisting with moving the deposition head 12. The deposition head 12 may move closer and further from the platform 16 and the component 18 as material and energy are added to the component 18 to allow for accurate deposition. The deposition head 12 may move the conductive bristles 32*a-h* in the direction of the material addition area 40 to maintain a consistent cooling temperature around the material addition area 40 of the component 18. As the component 18 increases in size the conductive bristles 32*a-h* may move with the component 18 to allow the component size to increase.

The cooling mechanism 14 may optionally include a shield 42 arranged to inhibit material addition onto the conductive bristles 32*a-h*, as shown in FIG. 1. The shield 42 may be located between the conductive bristles 32*a-h* and the deposition head 12. The shield 42 may be coupled to the diffuser 38 such that the shield 42 may move with the conductive bristles 42. The shield 42 may be spaced apart from the conductive bristles 32*a-h*. There may be a space 44 between the shields 42 to allow for the deposition of material and energy onto the component 18. The shield may be comprised of copper, aluminum, a combination thereof, or any other suitable material.

In another embodiment, a platform 216 may be used in a deposition system 210. The deposition system 210 is substantially similar to the deposition system described above as indicated by like reference numbers in FIGS. 3 and 4. The platform 216 may be mobile while the deposition head 12 is stationary.

The platform 216 may be used to move the component 18 further from the material depositor 24 and the energy source 26 as material is deposited, as suggested in FIGS. 3 and 4. As the material is deposited, the platform 216 may move as suggested by arrow 16*a*, in FIGS. 3 and 4, to maintain a controlled distance between the deposition head 12 and the material addition area 40 of the component 18. The platform 216 may be powered by a hydraulic actuator 220, a motor, or any other means for driving the movement of the platform 216.

The platform 216 may be mounted for movement relative to the deposition head 12, as shown in FIGS. 3 and 4. The platform 216 may move further from the deposition head 12 as material and energy are added to the component 18. The platform 216 may move such that the component interacts with the conductive bristles 32*a-h* as material is added to a material addition area 40 to maintain a consistent cooling temperature around the material addition area 40 of the component 18. The platform 216 may move relative to the deposition head 12 using a hydraulic pump 220, an actuator, a motor, or the like.

The cooling mechanism 14 may include purging nozzles 46. The purging nozzles 46 may discharge shield gas laterally from the component 18 to inhibit deposition of material onto the conductive bristles 32*a-h*, as shown in FIG. 3. The purging nozzles 46 may be located between the conductive bristles 32*a-h* and the deposition head 12. The purging nozzles 46 may discharge shield gas to flow along or over the conductive bristles 32*a-h*. A single purging nozzle may be used or a plurality of purging nozzles may be used to inhibit deposition of material. The purging nozzles 46 may be located on each conductive bristle 32*a-h* or only on the conductive bristles 32*a*, 32*e* closest in proximity to the deposition head 12, as depicted in FIG. 3.

The conductive bristles 32*h* may include a passageway 36. The passageway 36 may be sized to allow the cooling medium to flow through each of the conductive bristles 32*a-h* toward the component 18, as shown in FIGS. 4 and 5. The passageway 36 may be a hollow open passageway 36. The passageway 36 may include ribs, or other surfaces for assisting with airflow direction or support of the bristles 32.

A cooling mechanism 14 may include a combination of solid conductive bristles and bristles which may include a passageway.

Figure 6:
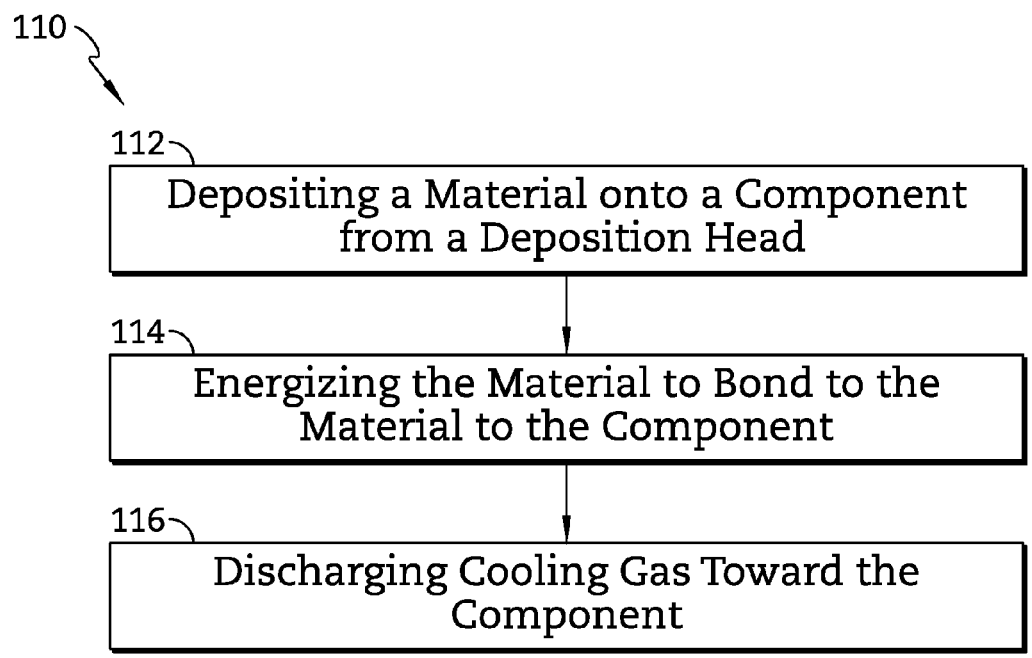
FIG. 6 is a block diagram of the method for depositing material onto a material addition area of a component.

As shown in FIG. 6, an illustrative method 110 for material addition is provided. According to a step 112 of the method 110, material may be deposited onto a component, such as the component 18 described above, by deposition head 12. The deposition head 12 may include the material depositor 24, which may dispense or discharge the material onto the component 18 positioned on the platform 16 or platform 216.

In a step 114 of the method 110, the material may be energized to bond the material to the component 18. The material may be energized by a directed energy beam. The directed energy beam is depicted as a laser 26 in FIGS. 1-6. The material may be energized by selecting a wavelength to be emitted from the laser 26 which may allow the material to bond to the component 18. The material may be heated during the energizing process such that the temperature of the material addition area may be greater than the temperature of the component 18.

The deposition head 12 may be moved to control the deposition of loose material 25 from the material depositor 24, as shown in FIGS. 1 and 2. The deposition head 12 may be moved by a hydraulic actuator 28. The hydraulic actuator 18 may move the component 18 upward/downward as shown by arrow 12A. The platform 16 may be stationary when the deposition head 12 is moved.

The component 18 may be moved to control the deposition of loose material 25 from the material depositor 24, as shown in FIGS. 3 and 4. The component 18 may be moved further from the material depositor 24 as loose material 25 is added to the material addition area 40. The component 18 may be moved by a hydraulic actuator 220 attached to platform 216, as shown in FIGS. 3 and 4. The component 18 may move upward/downward as depicted by arrow 16*a*. The deposition head 12 may be stationary when the platform 216 is moved.

In a step 116 of the method 110, cooling medium may be discharged toward the component 18. Cooling medium may be discharged from a gas source such as gas source 30, as shown in FIGS. 1-4. The cooling medium may flow along a plurality of conductive bristles 32*a-h* arranged between the gas source 30 and the component 18. The cooling medium may also flow though a passageway within each of the conductive bristles 32*h*.

The conductive bristles 32*a-h* may be moved around the component 18 as the component is moved upward and downward, as suggested in FIGS. 1-4. The conductive bristles 32*a-h* may be flexible and may bend according to the component 18. The conductive bristles 32*a-h* may maintain a constant distance from component 18 as component 18 moves upward and downward between the bristles. The flexibility of the conductive bristles 32*a-h* may vary based on the component to be built or repaired. In some embodiments, the bristles may not be made of a conductive material, but may instead be used to direct the cooling medium onto component 18.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A material deposition system, the system comprising a platform adapted to support a component for the addition of material,
    a deposition head including a material depositor configured to deposit material on a surface of a component supported on the platform and an energy source configured to energize material deposited onto a surface of a component supported on the platform to bond the material to the component, and
    a cooling mechanism including a gas source configured to discharge cooling medium toward a component supported on the platform and a plurality of thermally conductive bristles arranged to interact with cooling medium discharged from the gas source toward a component supported on the platform when the gas source discharges cooling medium,
    wherein the conductive bristles forms a passageway sized to allow the cooling medium to flow through each of the conductive bristles towards the component.

2. The system of claim 1, wherein the conductive bristles comprise a conductive material with a conductivity between about 1 W/(m K) and about 450W/(m K) at 25° C.

3. The system of claim 1, wherein the conductive bristles are arranged to contact the component, to increase heat transfer over cooling medium alone.

4. The system of claim 1, wherein the conductive bristles are located between the deposition head and the platform.

5. The system of claim 1, wherein the conductive bristles are coupled to the deposition head for movement with the deposition head.

6. The system of claim 5, wherein the deposition head and the conductive bristles are mounted for movement relative to the platform.

7. The system of claim 1, wherein the platform is mounted for movement relative to the deposition head.

8. The system of claim 7, wherein the platform is mounted for movement relative to the plurality of conductive bristles.

9. The system of claim 1, wherein the cooling mechanism further comprises purging nozzles configured to discharge a shield gas to inhibit material addition onto the conductive bristles.

10. The system of claim 9, wherein the purging nozzles are located between some of the plurality of the conductive bristles and the deposition head.

11. A material deposition system, the system comprising a platform adapted to support a component for the addition of material,
    a deposition head including a material depositor configured to deposit material on a surface of a component supported on the platform and an energy source configured to energize material deposited onto a surface of a component supported on the platform to bond the material to the component, and
    a cooling mechanism including a gas source configured to discharge cooling medium toward a component supported on the platform and a plurality of bristles arranged to interact with cooling medium discharged from the gas source toward a component supported on the platform when the gas source discharges cooling medium,
    wherein the cooling mechanism further comprises a shield arranged to inhibit material addition onto the conductive bristles.

12. The system of claim 11, wherein the shield is between the conductive bristles and the deposition head.

13. A material deposition system, the system comprising a platform,
    a deposition head including a material depositor and an energy source, and
    a cooling mechanism including a gas source configured to discharge cooling air toward a component supported on the platform and a plurality of bristles arranged to direct the cooling air from the gas source along the bristles toward the component.

14. The system of claim 13, wherein the cooling mechanism further comprises purging nozzles configured to discharge a shield gas to inhibit material addition onto the bristles.

15. The system of claim 13, wherein the bristles are conductive bristles and comprise a thermally conductive material with a conductivity between about 1 W/(m K) and about 450 W/(m K) at 25° C.

* * * * *